(12) United States Patent
Salzman

(10) Patent No.: US 11,574,887 B2
(45) Date of Patent: Feb. 7, 2023

(54) FLIP CHIP BACKSIDE MECHANICAL DIE GROUNDING TECHNIQUES

(71) Applicant: Texas Instruments Incorporated, Dallas, TX (US)

(72) Inventor: James Fred Salzman, Anna, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/828,268

(22) Filed: Mar. 24, 2020

(65) Prior Publication Data

US 2020/0219838 A1    Jul. 9, 2020

Related U.S. Application Data

(63) Continuation of application No. 15/249,424, filed on Aug. 28, 2016, now Pat. No. 10,600,753.

(Continued)

(51) Int. Cl.
*H01L 23/00* (2006.01)
*H01L 23/492* (2006.01)
(Continued)

(52) U.S. Cl.
CPC .......... *H01L 24/73* (2013.01); *H01L 23/492* (2013.01); *H01L 24/16* (2013.01); *H01L 24/27* (2013.01); *H01L 24/30* (2013.01); *H01L 21/4853* (2013.01); *H01L 23/3121* (2013.01); *H01L 23/49811* (2013.01); *H01L 24/13* (2013.01); *H01L 24/29* (2013.01); *H01L 24/32* (2013.01); *H01L 2224/13109* (2013.01); *H01L 2224/13111* (2013.01); *H01L 2224/13113* (2013.01); *H01L 2224/16225* (2013.01); *H01L 2224/16235* (2013.01); *H01L 2224/2745* (2013.01); *H01L 2224/2919* (2013.01); *H01L 2224/2929* (2013.01); *H01L 2224/2957* (2013.01);

(Continued)

(58) Field of Classification Search
CPC .............. H01L 23/40; H01L 2023/4037–4068
See application file for complete search history.

(56) References Cited

U.S. PATENT DOCUMENTS 5,459,352 A   10/1995  Layton et al.
5,763,950 A   6/1998   Fujisaki et al.
(Continued)

*Primary Examiner* — Bitew A Dinke
(74) *Attorney, Agent, or Firm* — Dawn Jos; Frank D. Cimino

(57) ABSTRACT

A semiconductor device includes an integrated circuit attached to a chip carrier in a flip chip configuration. A substrate extends to a back surface of the integrated circuit, and an interconnect region extends to a front surface of the integrated circuit. A substrate bond pad is disposed at the front surface, and is electrically coupled through the interconnect region to the semiconductor material. The chip carrier includes a substrate lead at a front surface of the chip carrier. The substrate lead is electrically coupled to the substrate bond pad. An electrically conductive compression sheet is disposed on the back surface of the integrated circuit, with lower compression tips making electrical contact with the semiconductor material in the substrate. The electrically conductive compression sheet is electrically coupled to the substrate lead of the chip carrier by a back surface shunt disposed outside of the integrated circuit.

15 Claims, 8 Drawing Sheets

Related U.S. Application Data

(60) Provisional application No. 62/211,503, filed on Aug. 28, 2015.

(51) Int. Cl.
*H01L 21/48* (2006.01)
*H01L 23/498* (2006.01)
*H01L 23/31* (2006.01)

(52) U.S. Cl.
CPC ............... *H01L 2224/29124* (2013.01); *H01L 2224/29386* (2013.01); *H01L 2224/30519* (2013.01); *H01L 2224/32225* (2013.01); *H01L 2224/32235* (2013.01); *H01L 2224/73204* (2013.01); *H01L 2224/73253* (2013.01); *H01L 2224/83101* (2013.01); *H01L 2224/83851* (2013.01); *H01L 2924/1431* (2013.01)

(56) References Cited

U.S. PATENT DOCUMENTS

| | | | | |
|---|---|---|---|---|
| 5,783,862 | A * | 7/1998 | Deeney | H01L 23/3733 165/104.17 |
| 5,819,406 | A * | 10/1998 | Yoshizawa | H01R 12/52 29/877 |
| 5,909,057 | A | 6/1999 | McCormick et al. | |
| 6,037,658 | A * | 3/2000 | Brodsky | H01L 23/42 257/706 |
| 6,432,749 | B1 | 8/2002 | Libres | |
| 6,437,437 | B1 | 8/2002 | Zuo et al. | |
| 6,462,952 | B1 * | 10/2002 | Ubukata | H01L 23/3672 361/719 |
| 6,837,306 | B2 * | 1/2005 | Houle | H01L 21/4882 165/185 |
| 7,200,006 | B2 | 4/2007 | Farrow et al. | |
| 7,361,985 | B2 * | 4/2008 | Yuan | H01L 23/3128 257/713 |
| 7,672,132 | B2 | 3/2010 | Fitzgerald et al. | |
| 7,995,344 | B2 * | 8/2011 | Dando, III | H05K 7/20445 361/710 |
| 8,289,712 | B2 * | 10/2012 | Holahan | H05K 7/20472 361/710 |
| 10,600,753 | B2 * | 3/2020 | Salzman | H01L 24/73 |
| 10,607,958 | B2 * | 3/2020 | Salzman | H01L 23/3185 |
| 11,043,467 | B2 * | 6/2021 | Salzman | H01L 23/3121 |
| 2002/0015288 | A1 * | 2/2002 | Dibene, II | H01R 12/7088 361/711 |
| 2002/0076851 | A1 * | 6/2002 | Eden | H01L 23/50 257/E23.079 |
| 2004/0099944 | A1 * | 5/2004 | Kimura | H01L 25/0655 257/706 |
| 2005/0134507 | A1 | 6/2005 | Dishongh et al. | |
| 2005/0180113 | A1 | 8/2005 | Shirakami et al. | |
| 2005/0248924 | A1 * | 11/2005 | Farrow | H01L 23/433 361/704 |
| 2006/0118925 | A1 | 6/2006 | Macris et al. | |
| 2007/0127211 | A1 | 6/2007 | Macris et al. | |
| 2009/0009973 | A1 | 1/2009 | Wyland et al. | |
| 2009/0065586 | A1 * | 3/2009 | Tasaki | H01Q 23/00 235/492 |
| 2009/0208722 | A1 * | 8/2009 | Timmerman | B32B 27/12 428/221 |
| 2009/0283902 | A1 * | 11/2009 | Bezama | H01L 23/3675 257/713 |
| 2010/0084761 | A1 | 4/2010 | Shinagawa et al. | |
| 2010/0224983 | A1 * | 9/2010 | Huang | H01L 23/3128 257/692 |
| 2011/0298109 | A1 | 12/2011 | Pagaila et al. | |
| 2011/0315343 | A1 | 12/2011 | Campbell et al. | |
| 2011/0316156 | A1 | 12/2011 | Pagaila et al. | |
| 2012/0241941 | A1 * | 9/2012 | Kim | H01L 23/367 257/712 |
| 2012/0241942 | A1 * | 9/2012 | Ihara | H01L 24/83 257/712 |
| 2012/0329213 | A1 | 12/2012 | Vinciguerra et al. | |
| 2013/0188319 | A1 | 7/2013 | Yamaguchi et al. | |
| 2013/0207256 | A1 | 8/2013 | Uno et al. | |
| 2014/0078677 | A1 * | 3/2014 | Dolci | H01L 23/40 361/719 |
| 2014/0138854 | A1 * | 5/2014 | Arora | H01L 23/3737 257/782 |
| 2014/0217575 | A1 | 8/2014 | Hung | |
| 2014/0239482 | A1 | 8/2014 | Kourakata et al. | |
| 2014/0264821 | A1 | 9/2014 | Tang et al. | |
| 2015/0035135 | A1 | 2/2015 | Hung et al. | |
| 2015/0084181 | A1 | 3/2015 | Hung | |
| 2015/0279761 | A1 * | 10/2015 | Bet-Shliemoun | H01L 23/42 257/714 |
| 2016/0093552 | A1 * | 3/2016 | Venugopal | H01L 23/373 257/29 |
| 2016/0254236 | A1 * | 9/2016 | Kim | H01L 24/00 257/659 |
| 2017/0148711 | A1 | 5/2017 | Hebert | |

* cited by examiner

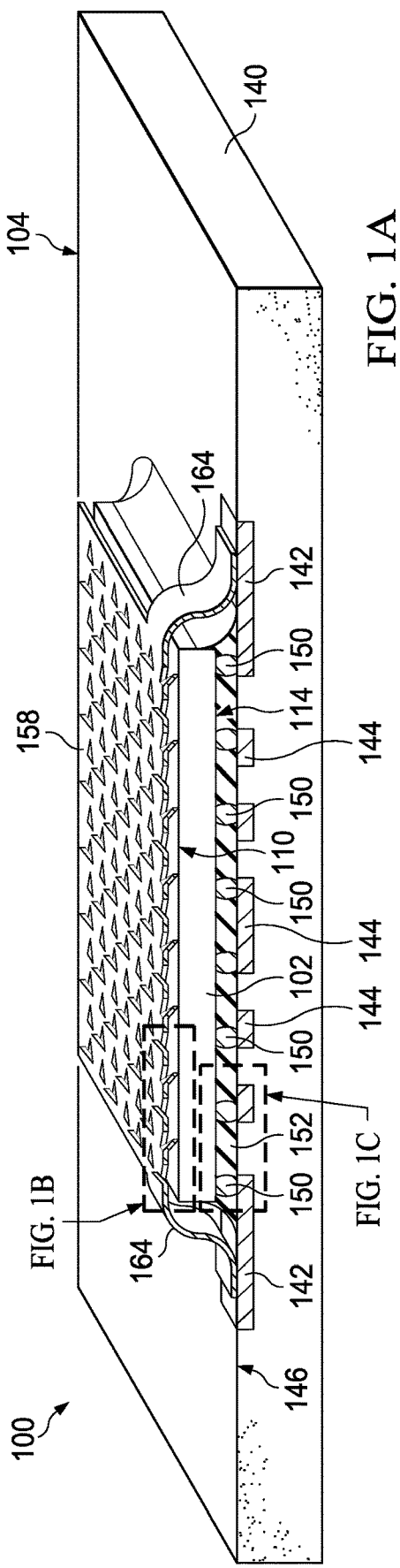
FIG. 1A
FIG. 1B
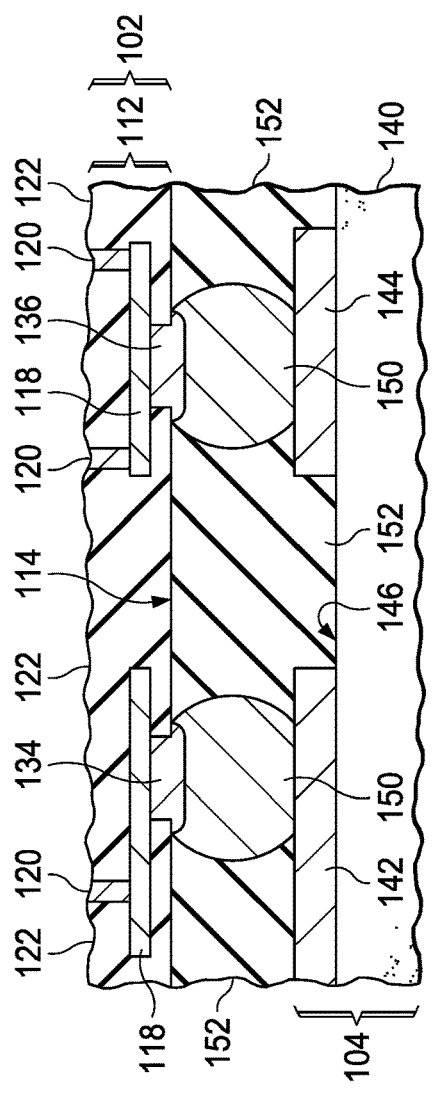
FIG. 1C

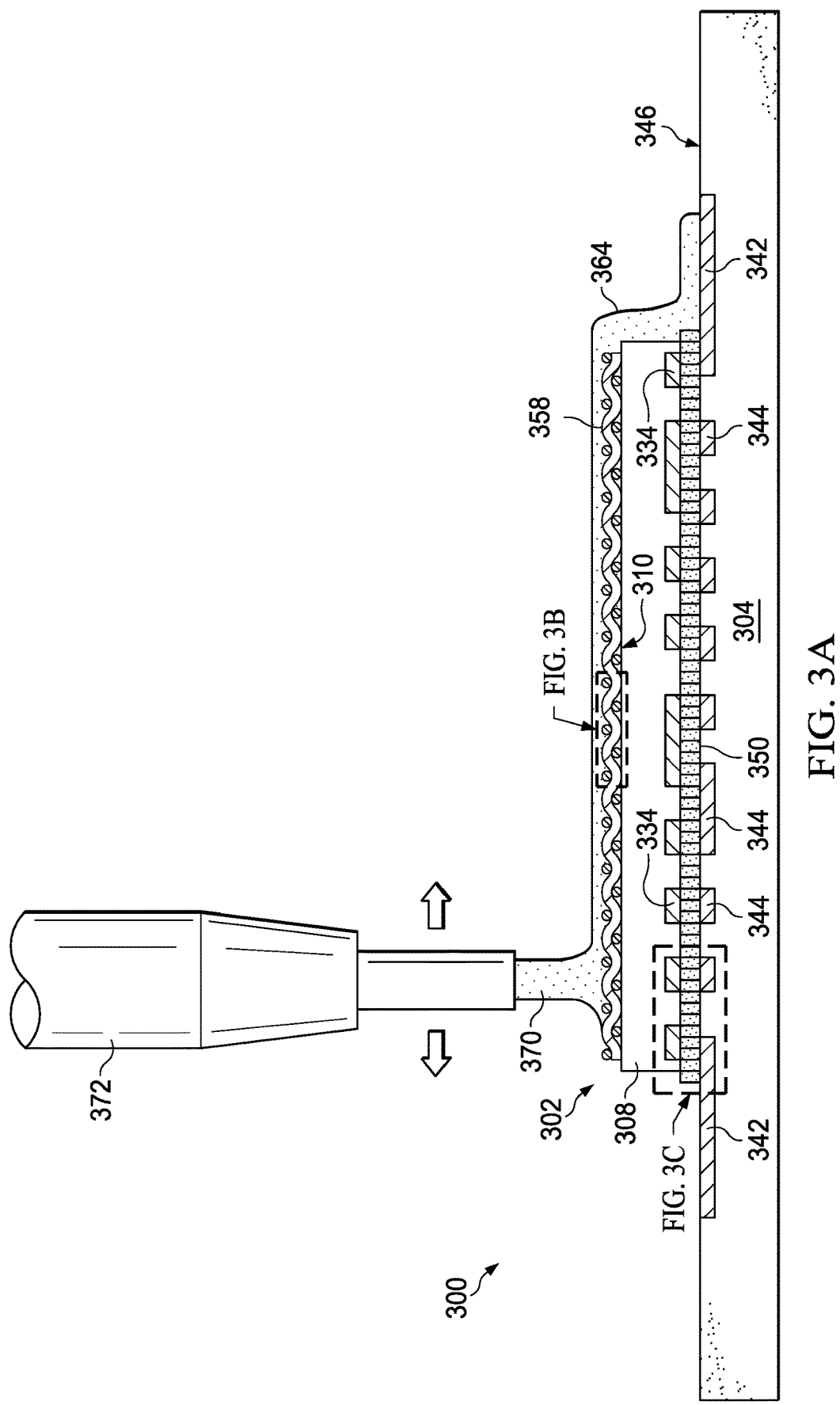

FLIP CHIP BACKSIDE MECHANICAL DIE GROUNDING TECHNIQUES

CROSS-REFERENCE TO RELATED APPLICATION

This application is a continuation of U.S. patent application Ser. No. 15/249,424, filed Aug. 28, 2016, which claims the benefit of priority under 35 U.S.C. § 119(e) of U.S. Provisional Application No. 62/211,503 (Texas Instruments), filed Aug. 28, 2015, which is hereby incorporated by reference in its entirety.

FIELD OF THE INVENTION

This invention relates to the field of semiconductor devices. More particularly, this invention relates to grounding structures of semiconductor devices.

BACKGROUND OF THE INVENTION

Integrated circuits with logic gates may be susceptible to latchup that is induced by generation of electron-hole pairs from high energy ionized particles, for example as encountered in space-based applications. The source, drain, and well regions of the logic gates can constitute parasitic bipolar junction transistors which combine to constitute a silicon controlled rectifier (SCR) in the substrate of the integrated circuit. Current from the electron-hole pairs flows through a lateral resistance between the parasitic bipolar junction transistors and turns on the SCR, inducing latchup. Wire bonded integrated circuits commonly have electrically conductive material, such as conductive adhesive or solder, on the back surface of the substrate to reduce the lateral resistance, which improves resistance to latchup. Bump bonded integrated circuits, also known as flip chips, are typically more prone to latchup, because the substrate material has a higher effective sheet resistance due to absence of conductive adhesive or solder. Reducing the resistance of the substrate of the integrated circuits during manufacture in a fab is not compatible with typical digital integrated circuit manufacturing and assembly processes, and undesirably increases costs.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device includes an integrated circuit attached to a chip carrier. The integrated circuit includes a substrate with semiconductor material, and an interconnect region on the substrate. The semiconductor material extends to a back surface of the integrated circuit, and the interconnect region extends to a front surface of the integrated circuit. The integrated circuit includes a plurality of n-channel metal oxide semiconductor (NMOS) transistors and a plurality of p-channel metal oxide semiconductor (PMOS) transistors. A substrate bond pad is disposed at the front surface of the integrated circuit. The substrate bond pad is electrically coupled through the interconnect region to the semiconductor material in the substrate of the integrated circuit.

The chip carrier includes a substrate lead at a front surface of the chip carrier. The front surface of the integrated circuit is facing the front surface of the chip carrier, referred to as a flip chip configuration. The substrate lead of the chip carrier is electrically coupled to the substrate bond pad of the integrated circuit.

An electrically conductive compression sheet is disposed on the back surface of the integrated circuit. The electrically conductive compression sheet has lower compression tips which make electrical contact with the semiconductor material in the substrate at the back surface. The electrically conductive compression sheet is electrically coupled to the substrate lead of the chip carrier through a back surface shunt disposed outside of the integrated circuit.

BRIEF DESCRIPTION OF THE VIEWS OF THE DRAWINGS

FIG. 1A through FIG. 1C are cross sections of an example semiconductor device.

FIG. 3A through FIG. 3E depict another example method of forming a semiconductor device with an electrically conductive compression sheet.

DETAILED DESCRIPTION OF EXAMPLE EMBODIMENTS

Figure 1B:
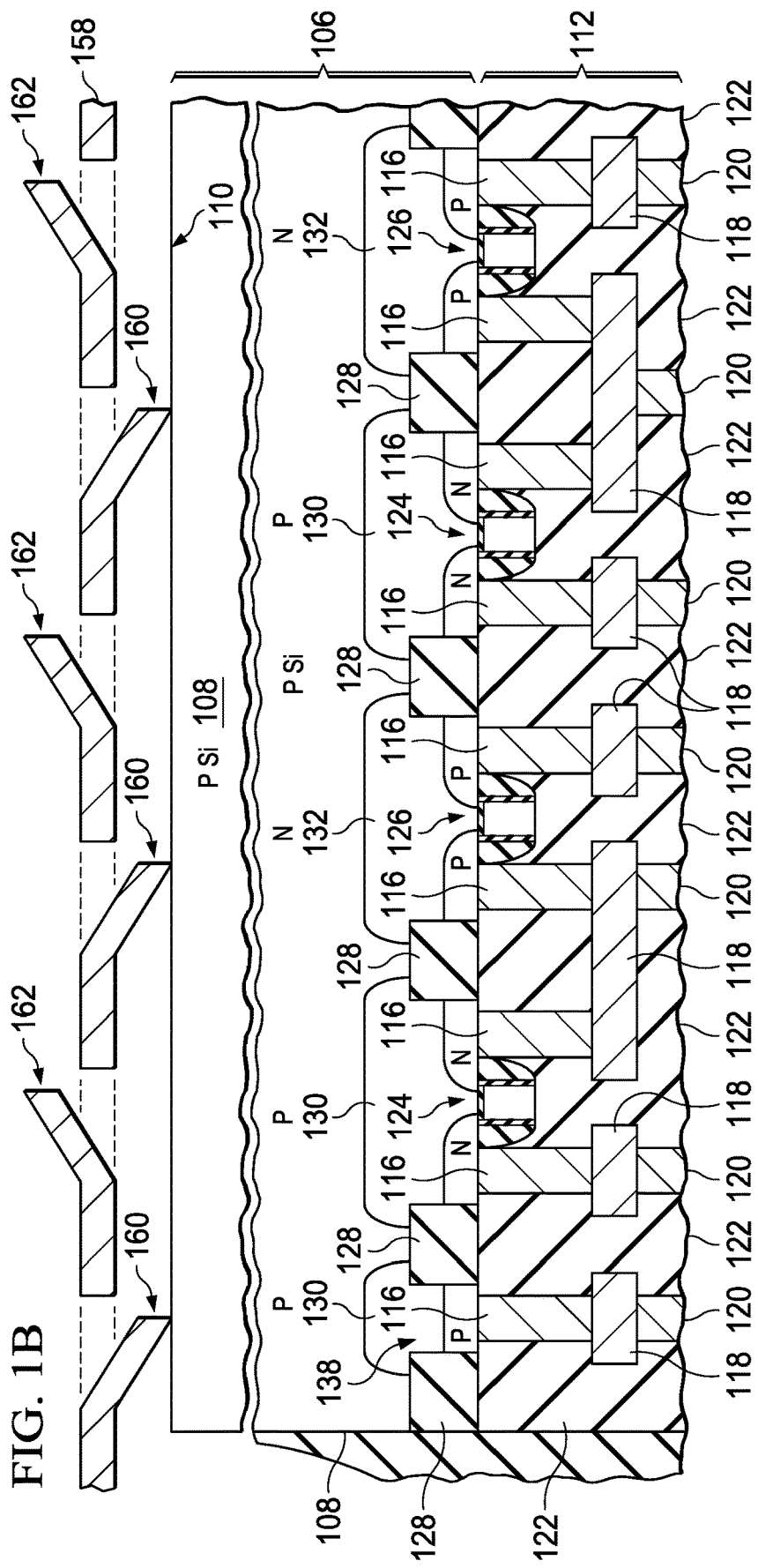

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The following patent application is related and hereby incorporated by reference: U.S. patent application Ser. No. 15/249,423. With its mention in this section, this patent application is not admitted to be prior art with respect to the present invention.

A semiconductor device includes an integrated circuit with a substrate and an interconnect region on the substrate. The substrate has semiconductor material which extends to a first surface of the integrated circuit, referred to herein as a back surface of the integrated circuit. The interconnect region includes interconnects such as contacts, metal lines and vias, and extends to a second surface of the integrated circuit, referred to herein as a front surface of the integrated circuit. NMOS and PMOS transistors are disposed in the integrated circuit. The integrated circuit further includes bond pads disposed at the front surface of the integrated circuit. Some of the bond pads are electrically coupled through some of the interconnects to the NMOS transistors and PMOS transistors. A substrate bond pad of the bond pads is electrically coupled through some of the interconnects to the semiconductor material of the substrate.

The integrated circuit is attached to a chip carrier so that the front surface of the integrated circuit is facing a first surface of the chip carrier, referred to herein as a front surface of the chip carrier. The integrated circuit is thus attached to the chip carrier in a flip chip configuration. The chip carrier includes leads at the front surface of the chip carrier. The leads include a substrate lead. The bond pads of the integrated circuit are electrically coupled to the leads of the chip carrier, for example by bump bonds, anisotropic conductive tape, or anisotropic conductive adhesive. The substrate lead of the chip carrier is electrically coupled to the substrate bond pad of the integrated circuit through a flip chip connector, such as a bump bond, which extends from the front surface of the integrated circuit to the front surface of the chip carrier. The substrate lead extends on the front surface of the chip carrier past the integrated circuit.

An electrically conductive compression sheet is disposed on the back surface of the integrated circuit. The electrically conductive compression sheet has first compression tips, referred to herein as lower compression tips, which make electrical contact with the semiconductor material in the substrate. The electrically conductive compression sheet is electrically coupled to the substrate lead of the chip carrier by a back surface shunt disposed outside of the integrated circuit. The back surface shunt may be an extension of the electrically conductive compression sheet or may be a separate component.

FIG. 1A through FIG. 1C are cross sections of an example semiconductor device. The semiconductor device 100 includes an integrated circuit 102 attached to a chip carrier 104. The integrated circuit 102 includes a substrate 106 having a semiconductor material 108 such as p-type silicon, as indicated in FIG. 1B. Other semiconductor materials and other conductivity types for the semiconductor material 108 are within the scope of the instant example. The semiconductor material 108 extends to a back surface 110 of the integrated circuit 102. The integrated circuit 102 further includes an interconnect region 112 on the substrate 106. The interconnect region 112 extends to a front surface 114 of the integrated circuit 102. The interconnect region 112 includes interconnects, for example contacts 116, metal lines 118, and vias 120. The interconnect region 112 further includes dielectric material 122 around the contacts 116, metal lines 118, and vias 120. The dielectric material 122 may include a plurality of layers, for example a pre-metal dielectric (PMD) layer contacting the substrate 106, intra-metal dielectric (IMD) layers laterally separating the metal lines 118 in a same metal level, intra-level dielectric (ILD) layers vertically separating the metal lines 118 in sequential metal levels, and one or more protective overcoat layers between a top level of the metal lines 118 and the front surface 114 of the integrated circuit 102. A plurality of NMOS transistors 124 and PMOS transistors 126 are parts of active components of the integrated circuit 102, possibly separated by field oxide 128. The field oxide 128 may have a shallow trench isolation (STI) structure as depicted in FIG. 1B, or may have a local oxidation of silicon (LOCOS) structure. The NMOS transistors 124 may be disposed in p-type wells 130 to provide desired performance parameters such as threshold voltage for the NMOS transistors 124. The PMOS transistors 126 may be disposed in n-type wells 132 to provide desired performance parameters for the PMOS transistors 126. The NMOS transistors 124 and the PMOS transistors 126 may be parts of logic gates or memory cells. A substrate bond pad 134 and a plurality of non-substrate bond pads 136 are distributed across the front surface 114. The bond pads 134 and 136 may be, for example plated bump bond pads as indicated in FIG. 1C. The bond pads 134 and 136 are electrically coupled to the metal lines 118 and/or the vias 120 possibly directly as indicated in FIG. 1C, or possibly through a redistribution layer (RDL) with metal lines connecting input/output pads at a periphery of the integrated circuit 102 to the bond pads 134 and 136. The substrate bond pad 134 is electrically coupled through some of the metal lines 118, the vias 120, and the contacts 116 to the semiconductor material 108 of the substrate 106, for example through a substrate tap 138. The non-substrate bond pads 136 are electrically coupled through some of the metal lines 118, the vias 120, and the contacts 116 to the active components of the integrated circuit 102.

The chip carrier 104 includes a base 140 of electrically insulating material such as ceramic or fiberglass reinforced polymer (FRP). The chip carrier 104 has a substrate lead 142 and non-substrate leads 144 of electrically conductive material on a front surface 146 of the base 140. The leads 142 and 144 may include, for example, copper, nickel, palladium, molybdenum, and/or gold. The substrate lead 142 extends past the integrated circuit 102.

The integrated circuit 102 is attached to the chip carrier 104 in a flip chip configuration, wherein the front surface 114 of the integrated circuit 102 is disposed facing the front surface 146 of the chip carrier 104. The substrate lead 142 of the chip carrier 104 is electrically coupled to the substrate bond pad 134 of the integrated circuit 102, for example by a bump bond 150. The non-substrate leads 144 of the chip carrier 104 are electrically coupled to the non-substrate bond pads 136 of the integrated circuit 102 in a similar manner, for example by bump bonds 150. The bump bonds 150 may include indium, tin, bismuth or other metals. Other structures for providing electrical coupling between the leads 142 and 144, and the bond pads 134 and 136, with the integrated circuit 102 and the chip carrier 104 in a flip chip configuration, such as anisotropic conductive tape or anisotropic conductive adhesive, are within the scope of the instant example. An underfill material 152 of electrically insulating material may be disposed between the front surface 114 of the integrated circuit 102 and the front surface 146 of the chip carrier 104, extending to a perimeter of the integrated circuit 102. The underfill material 152 may include, for example, epoxy, possibly with a stabilizing filler such as silica particles.

An electrically conductive compression sheet 158 is disposed on the back surface 110 of the integrated circuit 102, making electrical contact with the semiconductor material 108 in the substrate 106. The electrically conductive compression sheet 158 may include metal, for example stainless steel or spring bronze, and may have a sheet resistance below 0.1 ohms/square which may reduce incidences of latchup in the integrated circuit 102. The electrically conductive compression sheet 158 may be a continuous metal sheet, as indicated in FIG. 1A and FIG. 1B, or may include a plurality of metal strips or wires, possibly in a mesh arrangement. The electrically conductive compression sheet 158 includes lower compression tips 160 which make electrical connections to the semiconductor material 108 at the back surface 110 of the integrated circuit 102. The lower compression tips 160 may be tabs which are punched out of the continuous metal sheet, as depicted in FIG. 1A and FIG. 1B. Alternatively, the lower compression tips 160 may be dimples which are stamped into the continuous metal sheet, or may be electrically conductive structures attached to the continuous metal sheet. The lower compression tips 160 contact the semiconductor material 108 in a contact area which is a small portion of the total area of a total area of the back surface 110 of the integrated circuit 102. To provide a desired level of latchup reduction, lateral spacing between adjacent lower compression tips 160 may be less than 1 millimeter. The electrically conductive compression sheet 158 may optionally include second compression tips 162 (first set of tips), referred to herein as upper compression tips 162, disposed opposite from the lower compression tips 160 (second set of tips) which contact a package lid, not shown in FIG. 1A or FIG. 1B, attached to the chip carrier, to apply a desired uniform pressure on the lower compression tips 160. Each of the compression tips 160, 162 includes two parallel surfaces as shown above the plane along the surface of the compression sheet 158. Each of the two parallel surfaces form an acute angle with respect to the plane along the surface of the compression sheet 158. A plane along portion between the two parallel surfaces is perpendicular to the plane along the surface of the compression sheet 158. The electrically conductive compression sheet 158 may be particularly advantageous for manifestations of the instant example in which the semiconductor material 108 at the back surface 110 is p-type silicon, as p-type silicon has a higher resistivity than n-type silicon for a comparable dopant density, making the integrated circuit 102 with p-type silicon more susceptible to latchup.

A back surface shunt 164 makes an electrical connection between the electrically conductive compression sheet 158 and the substrate lead 142, outside of the integrated circuit 102. The back surface shunt 164 are shaped as two wing shaped shunt portions that electrically connect to a lead of the chip carrier 140, and wherein the two wing shaped shunt portions extend in opposite directions from opposite sides of the compression sheet 158. In the instant example, the back surface shunt 164 is an extension of the electrically conductive compression sheet 158, as indicated in FIG. 1A. In an alternate version of the instant example, the back surface shunt 164 may be a separate component from the electrically conductive compression sheet 158 (meaning they are separate from the compression sheet 158), which is electrically connected to the electrically conductive compression sheet 158 and the substrate lead 142. The back surface shunt 164 may reduce debiasing of the electrically conductive compression sheet 158 during a latchup event by maintaining the electrically conductive compression sheet 158 at the substrate potential on the substrate lead 142, during operation of the semiconductor device 100.

Figure 2A:
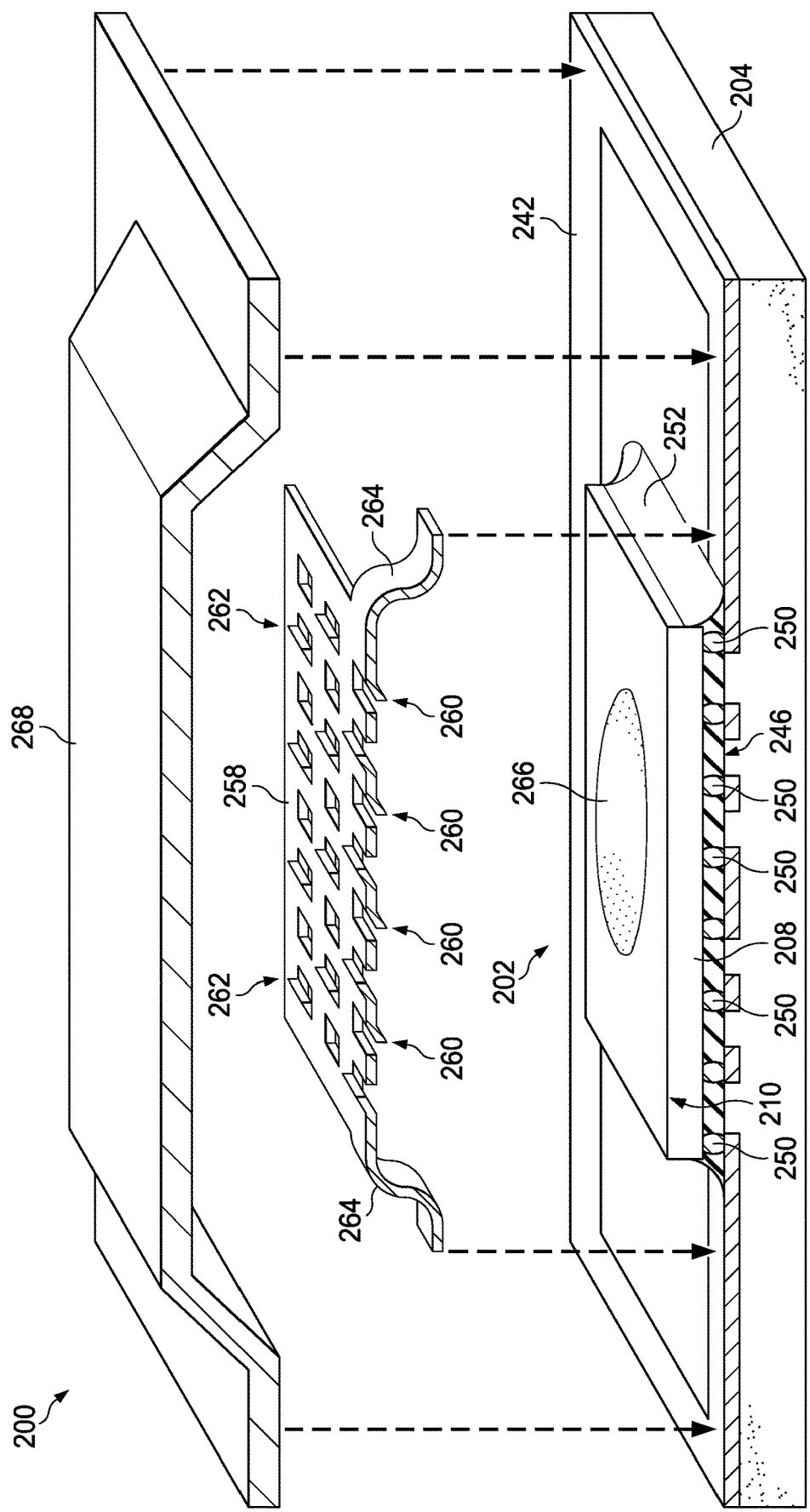
FIG. 2A and FIG. 2B depict an example method of forming a semiconductor device with an electrically conductive compression sheet.
Figure 2B:
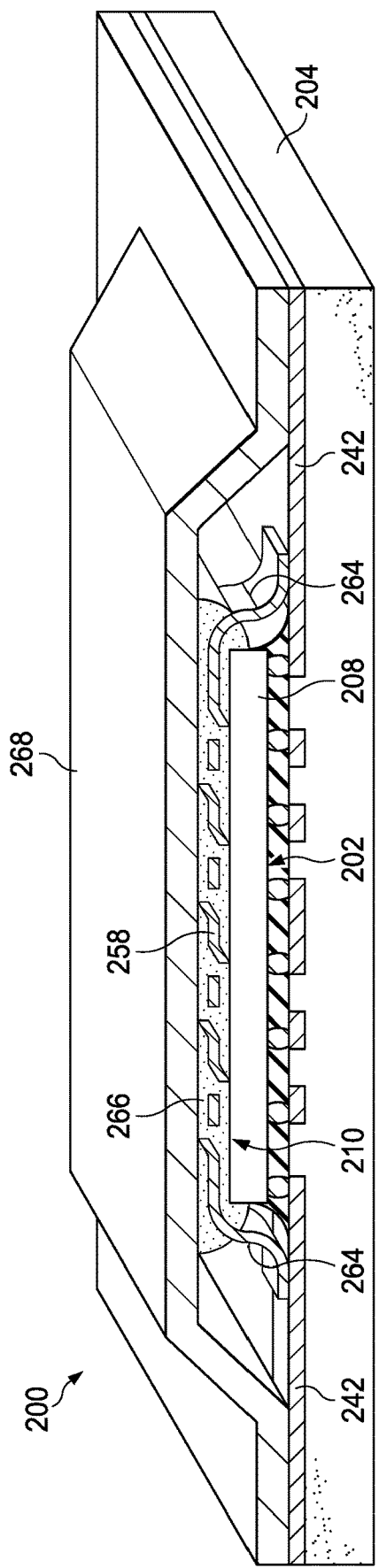

FIG. 2A and FIG. 2B depict an example method of forming a semiconductor device with an electrically conductive compression sheet. Referring to FIG. 2A, the semiconductor device 200 includes an integrated circuit 202 attached to chip carrier 204 in a flip chip configuration. The integrated circuit 202 has semiconductor material 208 extending to a back surface 210 of the integrated circuit 202, for example as described in reference to FIG. 1A through FIG. 1C. The integrated circuit 202 includes a plurality of NMOS transistors and PMOS transistors, not shown in FIG. 2A.

The chip carrier 204 includes a substrate lead 242 at a front surface 246 of the chip carrier 204. In the instant example, the substrate lead 242 may extend around a perimeter of the front surface 246 of the chip carrier 204. Electrical connections between the integrated circuit 202 and the chip carrier 204 may be provided by bump bonds 250 or other connection means. Underfill material 252 may be disposed between the integrated circuit 202 and the chip carrier 204.

During fabrication of the integrated circuit 202, dielectric layers such as silicon dioxide and silicon nitride may be formed on a back surface of a wafer containing the integrated circuit 202. These dielectric layers may be removed before the integrated circuit 202 is singulated from the wafer, or may be removed after the integrated circuit 202 is attached to the chip carrier 204. The dielectric layers may be removed, for example, by lapping, backside grinding, etching, or sandblasting.

In the instant example, a thermally conductive, electrically non-conductive material 266, referred to herein as heat sink compound 266 may optionally be disposed on the back surface 210 of the integrated circuit 202. An electrically conductive compression sheet 258 is disposed onto the back surface 210 of the integrated circuit 202. In one version of the instant example, the heat sink compound 266 may be disposed on the back surface 210 prior to disposing the electrically conductive compression sheet 258 on the back surface 210. In an alternate version, the heat sink compound 266 may be disposed on the back surface 210 after disposing the electrically conductive compression sheet 258 on the back surface 210. Lower compression tips 260 of the electrically conductive compression sheet 258 are configured to make electrical connections with the semiconductor material 208 at the back surface 210. Back surface shunts 264 are configured to make electrical connections between the electrically conductive compression sheet 258 and the substrate lead 242 on the chip carrier 204, outside of the integrated circuit 202. In the instant example, the back surface shunts 264 are extensions of the electrically conductive compression sheet 258. The back surface shunts 264 may be attached to the substrate lead 242 to provide a desired reliability for the electrical connection, for example by spot welding, compression bonding, gluing with an electrically conducting adhesive, or soldering. A package lid 268 is optionally attached to the front surface 246 of the chip carrier 204, covering the electrically conductive compression sheet 258. Second compression tips 262 of the electrically conductive compression sheet 258, referred to herein as upper compression tips 262, press against the package lid 268, so as to provide uniform pressure on the lower compression tips 260 on the semiconductor material 208. The package lid 268 may optionally make electrical connection to the substrate lead 242 around the perimeter of the front surface 246 of the chip carrier 204. The package lid 268 may be attached to the chip carrier 204, for example, by adhesives, possibly electrically conductive adhesives, welding or soldering.

Referring to FIG. 2B, the heat sink compound 266 extends through and fills the holes (as shown as a gap between the portions along a plane of the compression sheet 258) in the electrically conductive compression sheet 258 to contact both the back surface 210 of the integrated circuit 202 and the package lid 268, providing thermal conduction from the integrated circuit 202 to an external surface of the semiconductor device 200. As shown in FIG. 2A, the holes include a rectangular shape in one example. In another example, the holes include a triangular shape as shown in FIG. 1A, in the compression sheet 158. Similar to the holes, the tips 160, 162 include triangular or rectangular shapes. The electrically conductive compression sheet 258 in combination with the back surface shunts 264 may accrue the advantages discussed in reference to FIG. 1A through FIG. 1C.

Figure 3C:
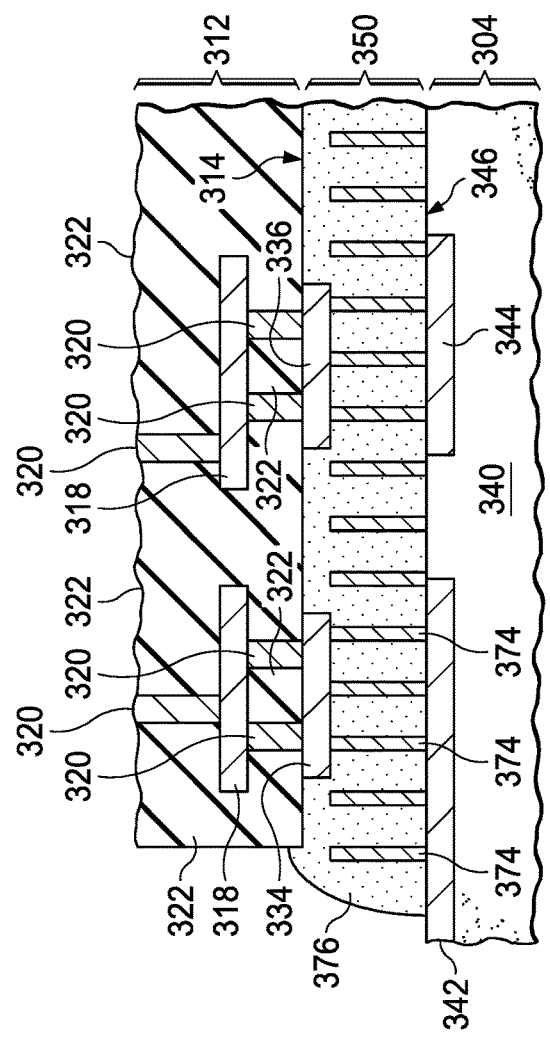

FIG. 3A through FIG. 3E depict another example method of forming a semiconductor device with an electrically conductive compression sheet. Referring to FIG. 3A, the semiconductor device 300 includes an integrated circuit 302 attached to a chip carrier 304 in a flip chip configuration. The integrated circuit 302 includes semiconductor material 308 in a substrate 306 which extends to a back surface 310 of the integrated circuit 302. The integrated circuit 302 includes an interconnect region 312 extending to a front surface 314 of the integrated circuit 302, wherein the front surface 314 is opposite from the back surface 310. The interconnect region 312 has a dielectric material 322 and interconnects, including metal lines 318 and vias 320, in the dielectric material 322. The integrated circuit 302 includes substrate bond pads 334 and non-substrate bond pads 336 at the front surface 314 of the integrated circuit 302. The substrate bond pads 334 are electrically coupled through the integrated circuit 302 to the semiconductor material 308 at the back surface 310. The integrated circuit 302 includes a plurality of NMOS transistors and PMOS transistors, not shown in FIG. 3A.

The chip carrier 304 includes substrate leads 342 and non-substrate leads 344 on a base 340, at a front surface 346 of the chip carrier 304. Electrical connections between the integrated circuit 302 and the chip carrier 304 may be provided by an anisotropic conductive adhesive 350, as indicated schematically in FIG. 3A and FIG. 3C, or other connection means. An anisotropic conductive adhesive includes electrical conductors 374 which extend vertically so as to provide electrical connections and which are laterally isolated by adhesive material 376. The substrate leads 342 are electrically coupled through the anisotropic conductive adhesive 350 to the substrate bond pads 334 of the integrated circuit 302. The non-substrate leads 344 are electrically coupled through the anisotropic conductive adhesive 350 to the non-substrate bond pads 336 of the integrated circuit 302 to the NMOS transistors and PMOS transistors of the integrated circuit 302.

Figure 3B:
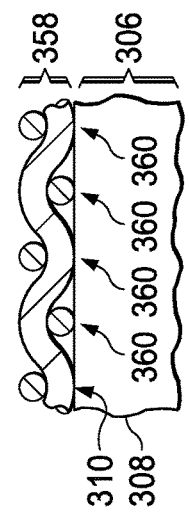

An electrically conductive compression sheet 358 is disposed onto the back surface 310 of the integrated circuit 302. In the instant example, the electrically conductive compression sheet 358 may include a metal mesh 358 such as a woven wire mesh as depicted in FIG. 3A and FIG. 3B. Another form of metal mesh for the electrically conductive compression sheet 358 is an expanded metal mesh. The electrically conductive compression sheet 358 includes lower compression tips 360 to make electrical connections with the semiconductor material 308 at the back surface 310. In the instant example, an electrically conductive adhesive 370 is applied to the electrically conductive compression sheet 358 on the back surface 310 of the integrated circuit 302. The electrically conductive adhesive 370 may include, for example, organic adhesive with metal particles or carbon particles. The electrically conductive adhesive 370 may be applied by a dispense process 372 as indicated in FIG. 3A. The dispense process 372 may be manually performed, semi-automatic or fully automatic. The electrically conductive adhesive 370 is distributed throughout the electrically conductive compression sheet 358 and contacts the back surface 310 of the integrated circuit 302. The electrically conductive adhesive 370 is further applied past the integrated circuit 302 onto the substrate leads 342 on the front surface 346 of the chip carrier 304 to form back surface shunts 364 which provide electrical connections between the electrically conductive compression sheet 358 and the substrate leads 342.

Figure 3D:
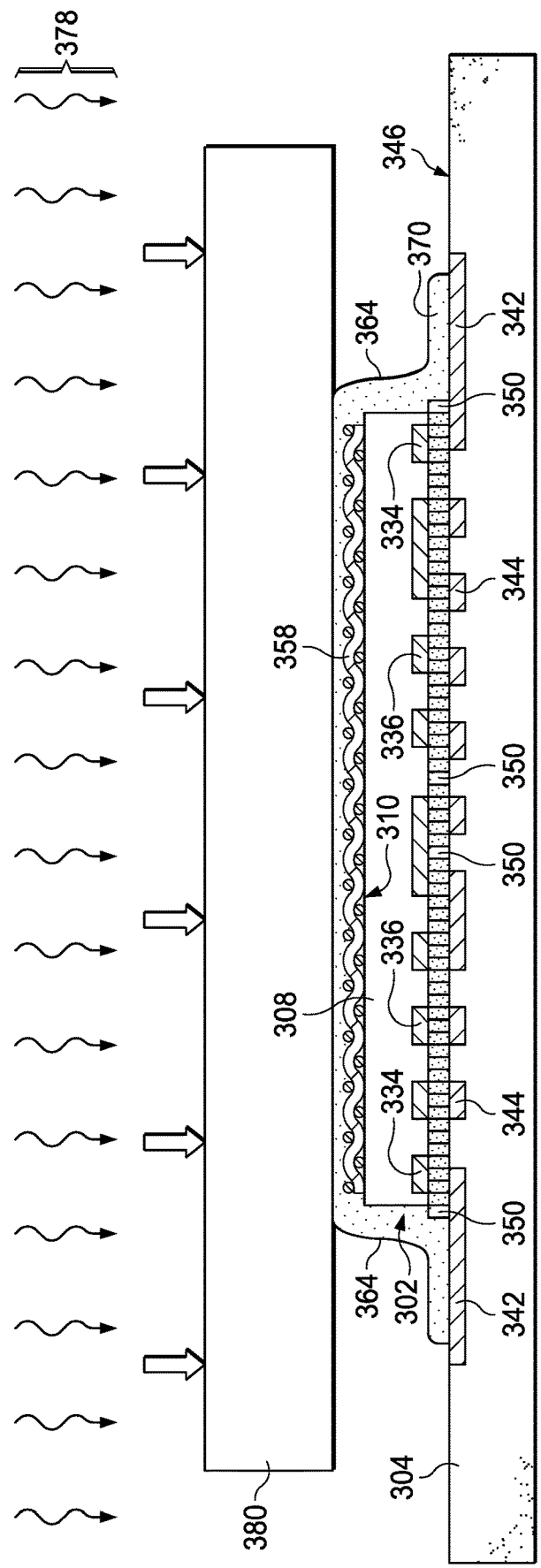

Referring to FIG. 3D, the electrically conductive adhesive 370 is cured to provide a permanent bond between the electrically conductive compression sheet 358 and the back surface 310 of the integrated circuit 302. The electrically conductive adhesive 370 may be cured, for example, by a radiant heating process 378 as depicted schematically in FIG. 3D, by a hot plate process, or by exposure to ultraviolet (UV) light. An optional pressure plate 380 may be applied to the electrically conductive adhesive 370 before and/or during the cure process to provide a desired thickness and flat surface of the cured electrically conductive adhesive 370. Forming the electrically conductive compression sheet 358 of metal mesh, combined with the application of the electrically conductive adhesive 370 may provide a desired low stress on the integrated circuit 302 compared to other manifestations of back surface connections.

Figure 3E:
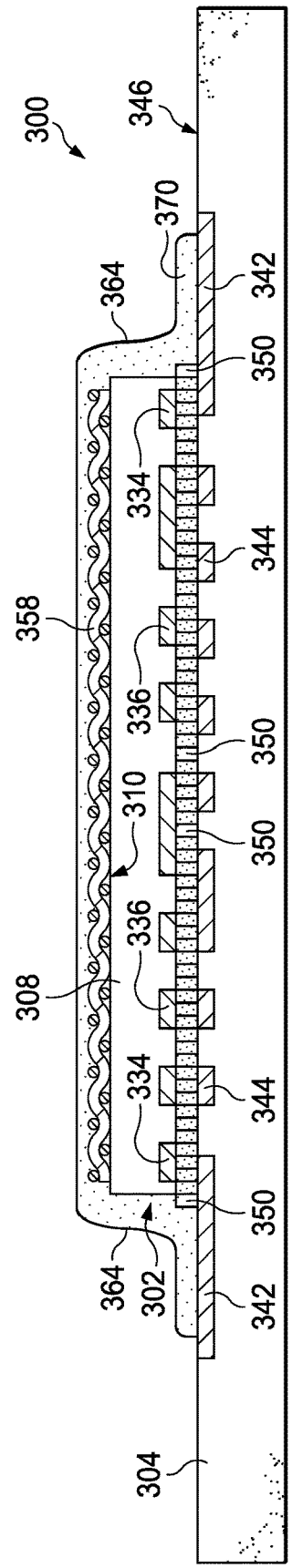

Referring to FIG. 3E, the semiconductor device 300 may be assembled with heat sink compound and a lid, not shown in FIG. 3E but possibly similar to the lid 268 depicted in FIG. 2A and FIG. 2B, over the electrically conductive compression sheet 358. Alternatively, potting compound or sealant such as epoxy may be applied over the electrically conductive compression sheet 358 and the back surface shunts 364, to electrically isolate the integrated circuit 302. Other steps to complete assembly of the semiconductor device 300 are within the scope of the instant example. The electrically conductive compression sheet 358 and the back surface shunts 364 provide the advantages described in reference to FIG. 1A through FIG. 1C. As can be seen from FIG. 3E the conductive adhesive 370 forms a top surface of the IC package and the top surface of the conductive adhesive 370 is planar. The conductive adhesive 370 physically contacts a top surface of the substrate. The conductive adhesive 370 functions as a shunt for the IC package. As shown in FIG. 3E, the conductive adhesive 370 physically contacts all sides of the semiconductor die except the bottom side (device side of the die 308.

Figure 4A:
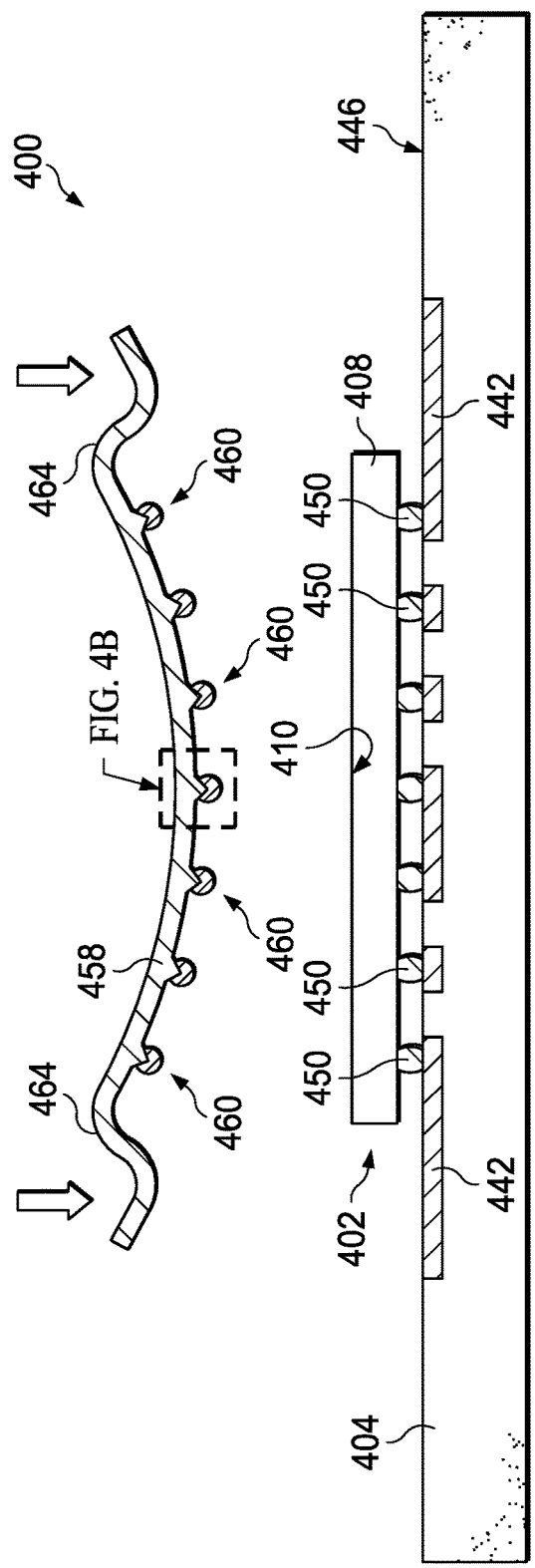
FIG. 4A through FIG. 4D depict a further example method of forming a semiconductor device with an electrically conductive compression sheet.
Figure 4B:
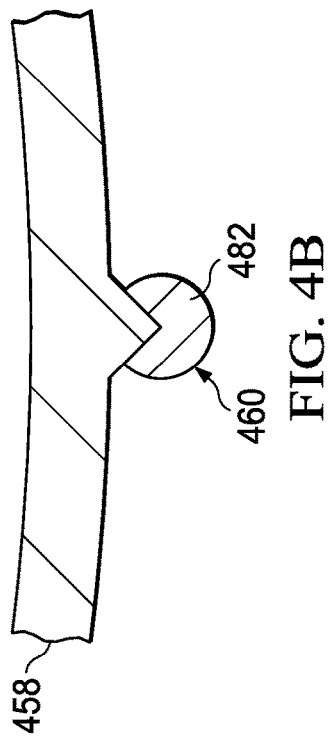

FIG. 4A through FIG. 4D depict a further example method of forming a semiconductor device with an electrically conductive compression sheet. Referring to FIG. 4A, the semiconductor device 400 includes an integrated circuit 402 attached to a chip carrier 404 in a flip chip configuration. The integrated circuit 402 has semiconductor material 408 extending to a back surface 410 of the integrated circuit 402, for example as described in reference to FIG. 1A through FIG. 1C. The integrated circuit 402 includes a plurality of NMOS transistors and PMOS transistors, not shown in FIG. 4A. The back surface 410 is substantially free of electrically insulating layers other than native oxide.

The chip carrier 404 includes a substrate lead 442 at a front surface 446 of the chip carrier 404. Electrical connections between the integrated circuit 402 and the chip carrier 404 are be provided by flip chip connectors 450, such as bump bonds or anisotropic conductive material. The substrate lead 442 is electrically coupled through the flip chip connectors 450 to the semiconductor material 408 of the integrated circuit 402.

An electrically conductive compression sheet 458 is disposed onto the back surface 410 of the integrated circuit 402. The electrically conductive compression sheet 458 includes lower compression tips 460, shown in detail in FIG. 4B, to make electrical connections with the semiconductor material 408 at the back surface 410. In the instant example, the electrically conductive compression sheet 458 is shaped to provide a desired uniform distribution of force by the lower compression tips 460 on the back surface 410 when assembled into the semiconductor device 400. In the instant example, electrically conductive contact enhancement material 482 such as aluminum or electrically conductive adhesive, shown in detail in FIG. 4B, may be disposed on the lower compression tips 460 to reduce contact resistance between the electrically conductive compression sheet 458 and the semiconductor material 408.

In the instant example, extensions of the electrically conductive compression sheet 458 provide back surface shunts 464 which make electrical connections between the electrically conductive compression sheet 458 and the substrate lead 442 on the chip carrier, outside of the integrated circuit 402, when the electrically conductive compression sheet 458 is assembled into the semiconductor device 400.

Figure 4C:
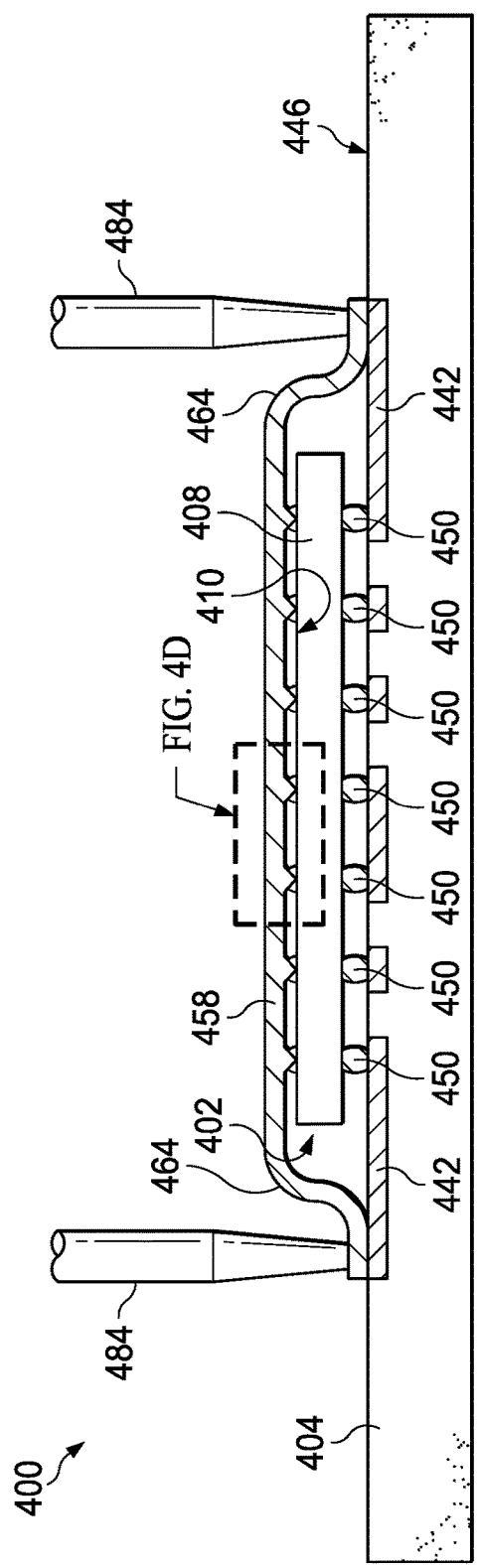
Figure 4D:
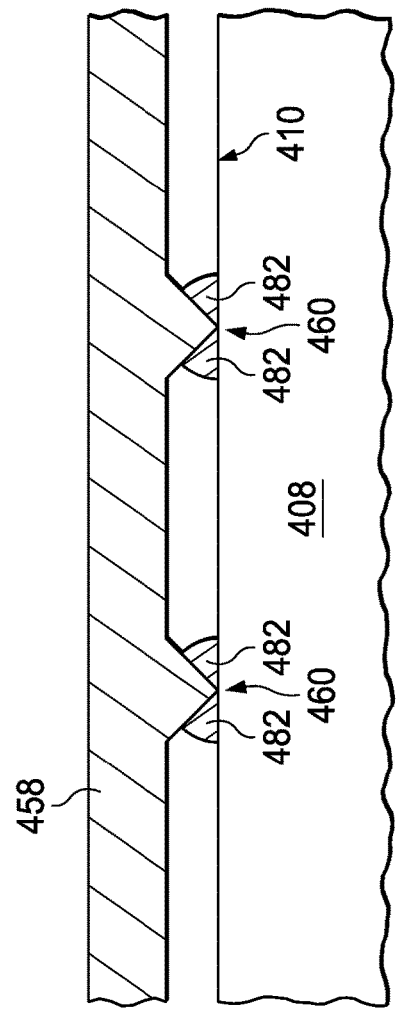

Referring to FIG. 4C, the electrically conductive compression sheet 458 is assembled into the semiconductor device 400 by attaching the back surface shunts 464 to the chip carrier 404, for example using an attaching apparatus 484. In one version of the instant example, the back surface shunts 464 may be attached by soldering the back surface shunts 464 to the substrate leads 442, in which case the attaching apparatus 484 comprises soldering iron tips 484. In another version of the instant example, the back surface shunts 464 may be attached by spot welding the back surface shunts 464 to the substrate leads 442, in which case the attaching apparatus 484 comprises spot welding tips 484. In a further version, the back surface shunts 464 may be attached by gluing the back surface shunts 464 to the substrate leads 442 using electrically conductive adhesive, in which case the attaching apparatus 484 comprises heated pressure tips 484. After the electrically conductive compression sheet 458 is attached, the lower compression tips 460 make electrical connections with the semiconductor material 408 at the back surface 410 of the integrated circuit 402, as shown in detail in FIG. 4D, and the back surface shunts 464 make electrical connections to the substrate leads 442 of the chip carrier 404. The electrically conductive contact enhancement material 482 may deform upon contact with the back surface 410, as shown in detail in FIG. 4D, which may reduce contact resistance between the electrically conductive compression sheet 458 and the semiconductor material 408. The semiconductor device 400 may be assembled with heat sink compound and a lid, not shown in FIG. 4C, over the electrically conductive compression sheet 458. Alternatively, potting compound or sealant such as epoxy may be applied over the electrically conductive compression sheet 458 and the back surface shunts 464, to electrically isolate the integrated circuit 402. Other steps to complete assembly of the semiconductor device 400 are within the scope of the instant example. The electrically conductive compression sheet 458 and the back surface shunts 464 provide the advantages described in reference to FIG. 1A through FIG. 1C.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit (IC) package comprising:
a semiconductor die including a first side and a second side opposite the first side;
a sheet attached only to the second side, the sheet including a wire mesh that electrically connects with a substrate via a conductive adhesive, wherein the wire mesh includes a first set of wires and a second set of wires in opposite directions, and wherein portions of the first set of wires form tips contacting the second side, wherein the conductive adhesive physically contacts all sides of the semiconductor die except the first side.

2. The IC package of claim 1, wherein the semiconductor die includes a plurality of PMOS transistors, a plurality of NMOS transistors and an interconnect region.

3. The IC package of claim 1, wherein the substrate includes substrate leads and non-substrate leads.

4. The IC package of claim 3, wherein sheet is electrically connected to at least one of the substrate leads.

5. The IC package of claim 1, wherein the first side is electrically connected to the substrate via bump bonds.

6. The IC package of claim 1, wherein the conductive adhesive is an anisotropic conductive adhesive or an anisotropic conductive tape.

7. The IC package of claim 1, wherein the conductive adhesive includes one of carbon particles and metal particles.

8. The IC package of claim 1 further comprising a lid attached to the sheet.

9. The IC package of claim 1 further comprising a compound or sealant attached to the sheet.

10. The IC package of claim 1, wherein the first set of wires and the second set of wires in opposite directions form a woven wire mesh.

11. The IC package of claim 1, wherein the conductive adhesive is an organic adhesive.

12. The IC package of claim 1, wherein the conductive adhesive forms a top surface of the IC package.

13. The IC package of claim 1, wherein a top surface of the conductive adhesive is planar.

14. The IC package of claim 1, wherein the conductive adhesive physically contacts a top surface of the substrate.

15. The IC package of claim 1, wherein the conductive adhesive functions as a shunt for the IC package.

\* \* \* \* \*